United States Patent
Lee et al.

(10) Patent No.: US 8,482,092 B2
(45) Date of Patent: Jul. 9, 2013

(54) SILICON PHOTOMULTIPLIER AND METHOD FOR FABRICATING THE SAME

(75) Inventors: Joon Sung Lee, Daejeon (KR); Yong Sun Yoon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 67 days.

(21) Appl. No.: 13/289,256

(22) Filed: Nov. 4, 2011

(65) Prior Publication Data

US 2012/0139071 A1 Jun. 7, 2012

(30) Foreign Application Priority Data

Dec. 7, 2010 (KR) .................. 10-2010-0124443

(51) Int. Cl.
*H01L 31/07* (2012.01)
*H01L 29/00* (2006.01)
*H01L 21/00* (2006.01)

(52) U.S. Cl.
USPC ............... 257/438; 257/536; 257/E31.126; 438/98

(58) Field of Classification Search
USPC ............... 257/438, 536, E31.126; 438/98
See application file for complete search history.

(56) References Cited

U.S. PATENT DOCUMENTS 7,759,623 B2  7/2010  Teshima et al.

FOREIGN PATENT DOCUMENTS

RU  1702831 A1  6/1997

OTHER PUBLICATIONS

Z. Sadygov et al., "Three Advanced Designs of Mirco-pixel Avalanche Photodiodes: Their Present Status, Maximum Possibilities and Limitations", Science Direct, Jun. 27, 2006, pp. 70-73, A 567, Joint Institute for Nuclear Research, Dubna, Russia.
David McNally et al., "Review of Solidstate Photomultiplier Developments by CPTA and Photonique SA", Elsevier B.V., 2008, A 00, Nuclear Instruments and Methods in Physics Research.

*Primary Examiner* — David S Blum

(57) ABSTRACT

Provided are a silicon photomultiplier and method for fabricating silicon photomultiplier. The silicon photomultiplier includes a first conductive type semiconductor layer; a first conductive type buried layer disposed in a lower portion of the first conductive type semiconductor layer, and having a higher impurity concentration than the first conductive type semiconductor layer; quench resistors spaced from each other and disposed on the first conductive type semiconductor layer; a transparent insulator formed on the first conductive type semiconductor layer, and exposing the quench resistors; second conductive type doped layers disposed under the quench resistors to contact the first conductive type semiconductor layer; and a transparent electrode commonly connected to the quench resistors electrically.

16 Claims, 5 Drawing Sheets

SILICON PHOTOMULTIPLIER AND METHOD FOR FABRICATING THE SAME

CROSS-REFERENCE TO RELATED APPLICATIONS

This U.S. non-provisional patent application claims priority under 35 U.S.C. §119 of Korean Patent Application No. 10-2010-0124443, filed on Dec. 7, 2010 the entire contents of which are hereby incorporated by reference.

BACKGROUND OF THE INVENTION

The present invention disclosed herein relates to a silicon photomultiplier and a method for fabricating the same, and more particularly, to a high density and high efficiency silicon photomultiplier and a method for fabricating the same.

Silicon photomultipliers are similar in structure to avalanche photodiodes, but they are characterized by operating in the Geiger mode. Under the Geiger mode, the number of charge carriers generated by photoexcitation which is initiated by light incident on photomultipliers geometrically increases through impact ionization which occurs as a result of acceleration by internal electrostatic field. Furthermore, while the avalanche photodiode has low current-to-photon gain (<1000) in the linear mode, silicon photomultipliers have breakdown current without restrictions of multiplication gain in the Geiger mode. Accordingly, with a simple structure, silicon photomultipliers are capable of high sensitivity photodetection up to the level of single photon.

Silicon photomultipliers include a plurality of microcells each of which independently detects and amplifies photon signals. When photons enter into microcells to produce electron-hole pairs, the Geiger breakdown occurs to generate a predetermined signal of which a magnitude corresponds to the amount of charges accumulated in the reverse-biased microcell diode.

Microcells in silicon photomultipliers are typically comprised of multiple layers doped with p+/n−/n+ or n+/p−/p+. As a reverse voltage applied to the diode structure increases, a depletion layer between p+ and n+ regions expands so that a breakdown occurs at a voltage above the breakdown voltage.

On the other hand, when a breakdown occurs in a microcell, the microcell becomes unable to operate, and the device may be damaged by the large currents. Therefore, the microcell should be recovered from the breakdown state in a short period of time. For this, a passive quenching technique employing a series connection of a quench resistor to a diode of a microcell may be applied to silicon photomultipliers. When an instantaneous current flows by electrical breakdown, a quench resistor induces an ohmic voltage drop to protect the device and to clear the breakdown state.

Such silicon photomultipliers may be fabricated using a semiconductor photolithography. When photolithography is employed to form a silicon photomultiplier, processes of forming a diode and a quench resistor are carried out separately. Consequently, the cost of manufacturing a silicon photomultiplier increases.

Since the area onto which the quench resistors are formed cannot work as the light sensing area, the photon detection efficiency becomes lower as the quench resistor area becomes larger in a silicon photomultiplier. Consequently, a method for reducing the quench resistor forming region has been in need.

Further, since the dynamic range of light intensity measurement in silicon photomultipliers depends on the ratio of the light-sensing area of one microcell over the total surface area of the device and the number of microcells, a method for forming high-density microcells is required to improve the dynamic range.

SUMMARY OF THE INVENTION

The present invention provides a silicon photomultiplier including high density and high efficiency microcells.

The present invention also provides a method for fabricating a silicon photomultiplier including high density and high efficiency microcells.

Objects to be attained by the present disclosure will not be limited to the objects stated herein. Accordingly, a person having ordinary skill in the art will clearly understand other objects not described herein.

Embodiments of the present invention provide silicon photomultipliers, including: a first conductive type semiconductor layer; a first conductive type buried layer disposed in a lower portion of the first conductive type semiconductor layer, and having a higher impurity concentration than the first conductive type semiconductor layer; quench resistors spaced from each other and disposed on the first conductive type semiconductor layer; a transparent insulator formed on the first conductive type semiconductor layer, and exposing the quench resistors; second conductive type doped layers disposed under the quench resistors to contact the first conductive type semiconductor layer; and a transparent electrode covering the transparent insulator and the top surfaces of the quench resistors, the transparent electrode being commonly connected to the quench resistors electrically.

In other embodiments of the present invention, methods for fabricating a silicon photomultiplier include: forming a first conductive type buried layer in a lower portion of a first conductive type semiconductor layer; forming a second conductive type doped layer in an upper portion of the first conductive type semiconductor layer; forming a quench resistor layer on the second conductive type doped layer; forming quench resistors defined by recessed regions which are formed by patterning the quench resistor layer, the second conductive type doped layer and portions of the first conductive type semiconductor layer; forming a transparent insulator filling the recessed regions; and forming a transparent electrode covering the transparent insulator and surfaces of quench resistors.

Details of other embodiments are described in the following brief description of the drawings.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
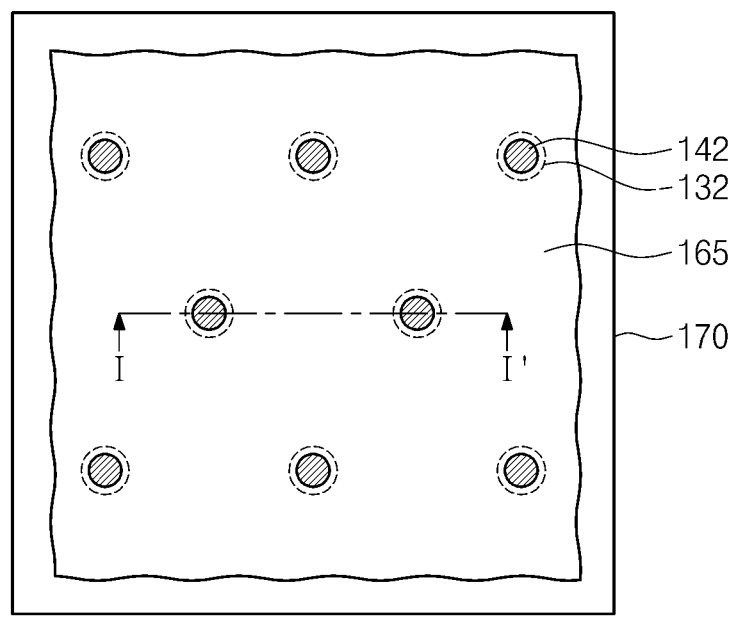
FIG. 1 is a schematic plan view of a silicon photomultiplier according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. The present invention is defined only by the scope of the claims attached herein. Like reference numerals refer to like elements throughout.

Terms used in this disclosure are to explain embodiments, not to limit the present invention. The terms of a singular form may include plural forms unless referred to the contrary. Terms "comprises' and/or "comprising" do not exclude existence or addition of one or more than one components, steps, movements and/or apparatus.

Hereinafter, referring to FIGS. 1, 2A and 2B, a silicon photomultiplier according to the embodiments of the present invention will be more fully described.

FIG. 1 is a schematic plan view of a silicon photomultiplier according to an embodiment of the present invention. FIGS. 2A and 2B are cross-sectional views of a silicon photomultiplier according to an embodiment of the present invention, which are taken along the line I-I' of FIG. 1.

The silicon photomultiplier may include tens to thousands or more of microcells. Each microcell may be driven independently, and may detect and amplify photons signal.

Figure 2A:
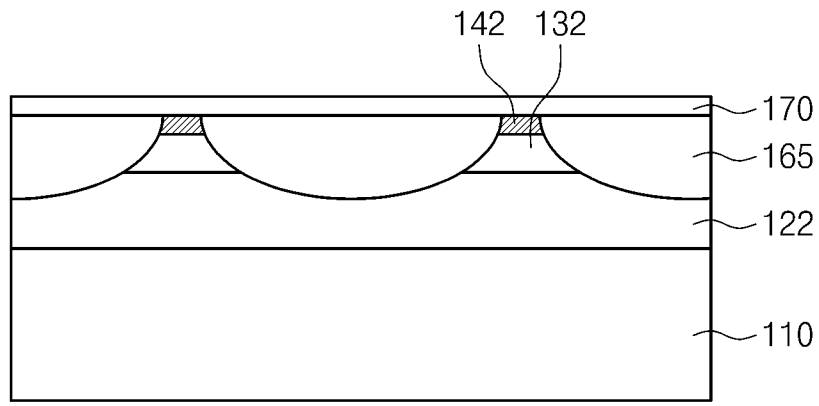
FIGS. 2A and 2B are cross-sectional views of a silicon photomultiplier according to an embodiment of the present invention, which are taken along the line I-I' of FIG. 1.
Figure 2B:
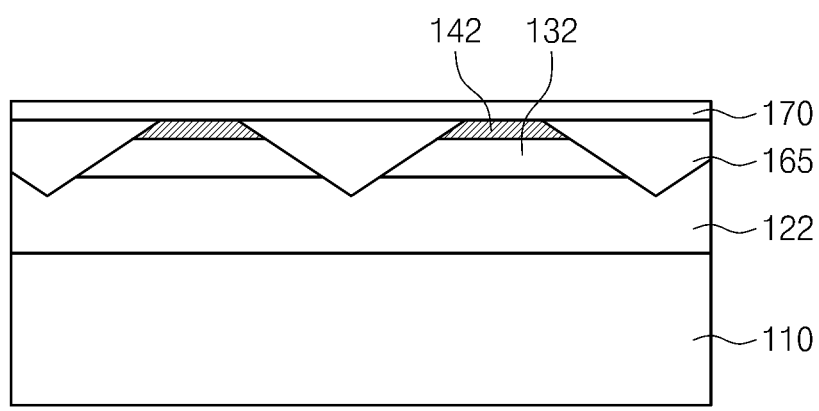

Referring to FIGS. 1, 2A and 2B, each of the microcells according to an embodiment may include a p+ type buried layer 110, a p− type semiconductor layer 122, an n+ type doped upper layer 132, a quench resistor 142, a transparent insulator 165 and a transparent electrode 170.

In the embodiment, the p+ type buried layer 110 may be disposed under the p− type semiconductor layer 122, and the transparent insulator 165 may be disposed on the p− type semiconductor layer 122. The quench resistors 142 may be spaced from each other and formed over the p− type semiconductor layer 122. The n+ type doped upper layer 132 contacting the p− type semiconductor layer 122 may be disposed under the quench resistors 142. In addition, the transparent electrode 170 contacting the top surfaces of the transparent insulator 165 and the quench resistors 142 may be formed over the p− type semiconductor layer 122.

The p− type semiconductor layer 122 may be either a bulk silicon substrate or a p− type epitaxial layer. The p+ type buried layer 110 may be a p+ type doped layer prepared by doping p type impurities of which concentration is higher than that of the impurities of the p− type semiconductor layer 122, and may be disposed under the p− type semiconductor layer 122.

The n+ type doped upper layer 132 may be disposed under the quench resistors 142 between the microcells. The n+ type doped upper layer 132 contacts the p− type semiconductor layer 122 so that a pn junction may thus be formed at the boundary between the p− type semiconductor layer 122 and the n+-doped layer. When light enters into the silicon photomultiplier, charge carriers are generated by photoexcitation. The generated charge carriers are accelerated in the electric field to cause ionizing collisions to be occurred successively near the boundary (i.e. pn junction) between the n+ type doped upper layer 132 and the p− type semiconductor layer 122, thereby leading to electrical breakdown. A current pulse may be generated and detected by a detector outside. Further, the current pulse causes an ohmic voltage drop at the quench resistors 142, and then the relevant microcells return to a stand-by state for receiving light from the breakdown state.

The quench resistors 142 are separated from each other over the p− type semiconductor layer 122, and disposed on the n+ type doped upper layer 132. When viewed from the top, the quench resistors 142 may have a circular shape, and may be arranged in a pattern of hexagonal lattice. In addition, the quench resistors 142 may be disposed on the same plane as the top surface of the transparent insulator 165.

The quench resistors 142 quench the breakdown (i.e., Geiger discharge) generated by photoexcitation. The quench resistors 142 may be formed of a high-resistivity material such as polysilicon so as to have the resistance ranging tens to hundreds of kΩ. The resistance of the quench resistor 142 may be a few orders larger than the sheet resistance (for example, about 100Ω/☐ or less) of the transparent electrode 170.

In the embodiment, since the transparent electrode 170 is formed on the entire surfaces of the microcells, and commonly connected to the quench resistors 142, metal electrodes are not formed separately, except as wire bonding pads. Therefore, the area occupied by the metal electrodes where light is not detected may decrease, and the light-receiving area of the silicon photomultiplier may increase, thereby resulting in an enhanced photon detection efficiency.

In each of microcells, the transparent insulator 165 may be disposed between the transparent electrode 170 and the p− type semiconductor layer 122. The transparent insulator 165 may be made of silicon oxide, silicon nitrides, polydimethylsiloxane (PDMS) or poly(methyl methacrylate) (PMMA). A portion of lower surface of the transparent insulator 165 may contact the p− type semiconductor layer 122. In addition, the farther the transparent insulator 165 is from the quench resistors 142, the thicker the transparent insulator 165 may be.

According to an embodiment as illustrated in FIG. 2A, the transparent insulator 165 may have a lower surface concaved towards the p+ type buried layer 110. Specifically, the transparent insulator 165 may have a concave lower surface with a profile formed along the direction of the electric field generated inside the p− type semiconductor layer 122 when bias is applied. According to another embodiment as illustrated in FIG. 2B, the transparent insulator 165 may have a triangular cross section with a vertex towards the p+ type buried layer 110, instead of a round surface.

The transparent electrode 170 may cover the entire surfaces of the microcells, and may be electrically connected to the quench resistors 142. The transparent electrode 170 may be formed of a transparent material such as indium tin oxide (ITO), indium zinc oxide (IZO), indium tin zinc oxide (ITZO), indium cesium oxide (ICO) or Poly(3,4-ethylenedioxythiophene.

FIGS. 3 through 7 are cross-sectional views illustrating a method for fabricating a silicon photomultiplier according to an embodiment of the present invention.

Figure 3:
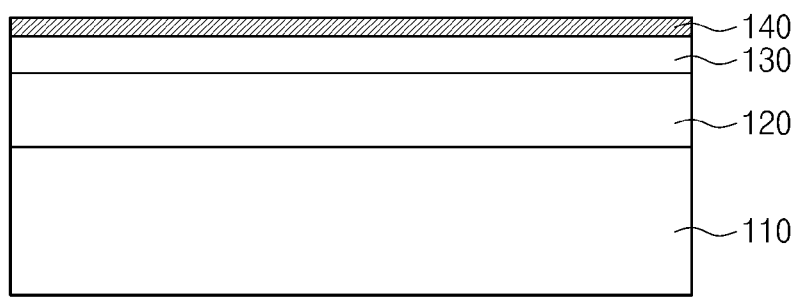
FIGS. 3 through 7 are cross-sectional views illustrating a method for fabricating a silicon photomultiplier according to an embodiment of the present invention.

Referring to FIG. 3, a p+ type buried layer 110 is formed in a lower portion of a p− type semiconductor layer 120. The p type impurity concentration in the p+ type buried layer 110 is higher than that in the lower portion of p− type semiconductor layer 120. The p+ type buried layer 110 may be formed by doping an upper portion of a p type semiconductor substrate with p+ impurities and then, growing a p− type epi-layer on top of the doped surface. Alternately, the p+ type buried layer 110 may be formed to a predetermined depth in a substrate by performing high energy ion implantation.

An n+ type doped layer 130 is formed at the upper portion of a p− type semiconductor layer 120 by doping n type impurities. Accordingly, a pn junction may be formed at the boundary between the p− type semiconductor layer 120 and the n+ type doped layer 130. In addition, a quench resistor layer 140 may be formed on top of the n+ type doped layer 130, and the quench resistor layer 140 may be formed by depositing polysilicon.

Figure 4:
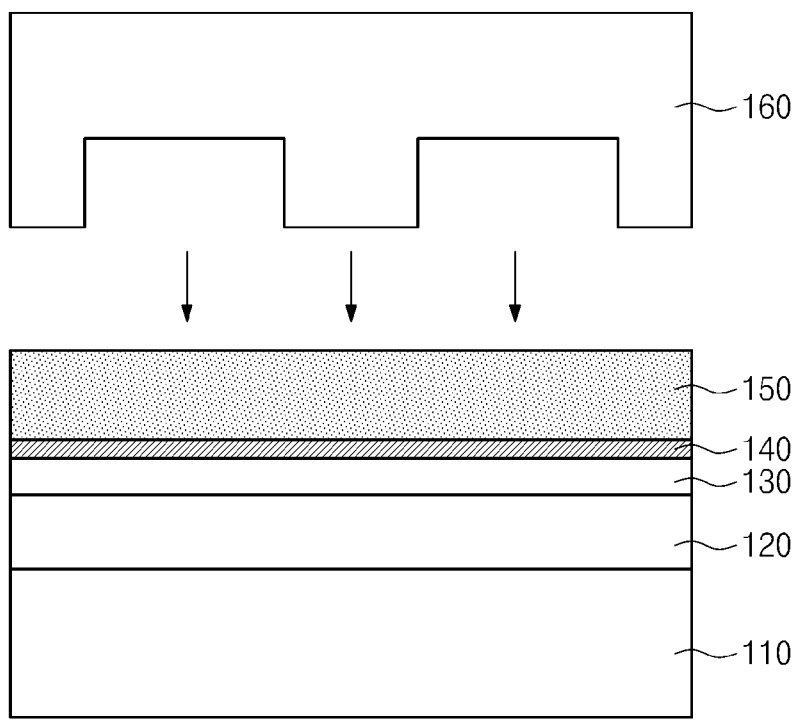

Referring to FIG. 4, a photoresist layer 150 is coated on the entire surface of the quench resistor layer 140, and an imprinting mold 160 for nanoimprint lithography is prepared.

Description on a method of forming the imprinting mold 160 will be described in detail below. A pattern is formed on the photoresist layer on a substrate (not shown) using E-beam lithography, a metal mask layer is deposited and lifted off, and then a master mold is formed by reactive ion etching. Further, the pattern is imprinted onto the photoresist layer applied on the upper portion of a quartz substrate using the master mold, and then a working mold is formed by etching the quartz substrate. The formed working mold is used as the imprinting mold 160.

Figure 5:
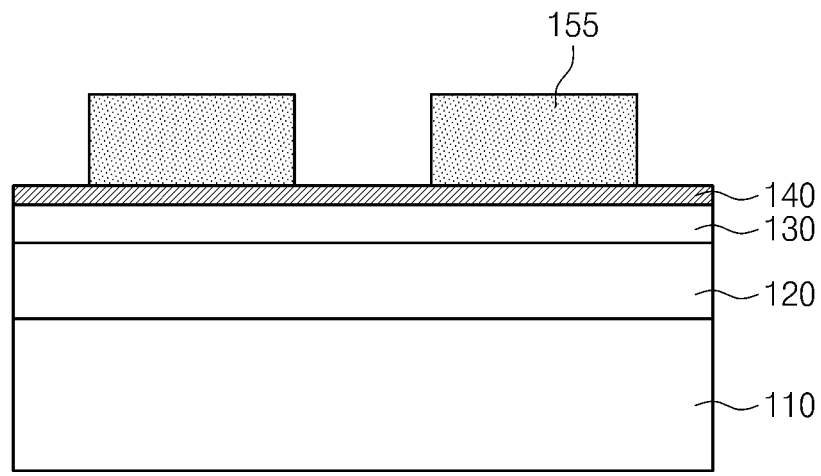

After that, the pattern is imprinted onto the photoresist layer 150 using the imprinting mold 160 for nanoimprint lithography. Accordingly, as illustrated in FIG. 5, mask patterns 155 may be formed on the quench resistor layer 140. The mask patterns 155 expose portions of the quench resistor layer 140 corresponding to the light-receiving area onto which light is incident.

Alternately, according to another embodiment, the mask patterns 155 may be formed using photolithography process instead of nanoimprint lithography.

Figure 6:
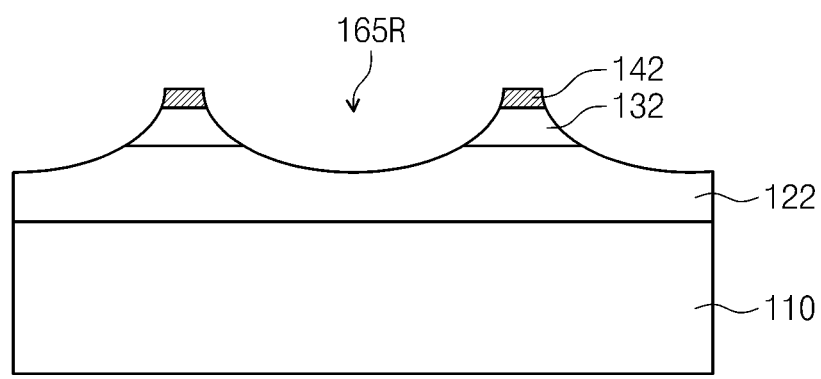

Referring to FIG. 6, recessed regions 165R may be formed by patterning portions of the quench resistor layer 140, n+ type doped upper layer 132 and p type semiconductor layer 120 using the mask patterns 155. As the recessed regions 165R are formed, the quench resistor layer 140 is patterned into quench resistors 142.

Specifically, the recessed regions 165R may expose the p− type semiconductor layer 122. In addition, the lower the portion of the recessed region 165R is, the narrower the width of the recessed region 165R may be, and the farther the recessed region 165R is from the quench resistors 142, the deeper the recessed region 165R may be.

According to the embodiment, the recessed regions 165R may be formed using an anisotropic dry etching process and an isotropic wet etching process. Specifically, trenches may be formed by anisotropically etching portions of the quench resistor layer 140, the n+ type doped upper layer 132 and the p− type semiconductor layer 122. Thereafter, the trenches may be isotropically etched to form the recessed regions 165R having a lower surface concaved towards the p+ type buried layer 110.

According to another embodiment, the recessed regions 165R may be formed through an isotropic dry etching process having relatively weak anisotropy or an anisotropic wet etching. In that case, as shown in FIG. 2B, recessed regions 165R with inverted triangular shapes may be formed.

Figure 7:
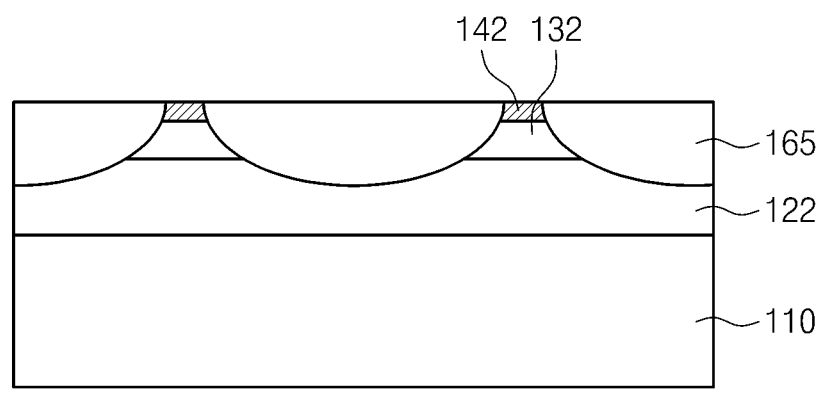

Referring to FIG. 7, the transparent insulator 165 filling recessed regions 165R is formed.

Specifically, the transparent insulator 165 may be formed by forming a transparent insulating layer which covers the entire surface of the structure the recessed regions 165R are formed, and exposing the top surface of the quench resistors 142 using a planarization method such as chemical mechanical polishing. Accordingly, the top surface of the transparent insulator 165 may be coplanar with the top surfaces of the quench resistors 142. The transparent insulating layer may be formed of silicon dioxide film, silicon nitrides, spin-on-glass, PDMS or PMMA.

Next, as shown in FIG. 2, a transparent electrode 170 covering the top surfaces of the transparent insulator 165 and the quench resistors 142 are formed.

The transparent electrode 170 may directly contact the quench resistors 142 formed in the microcells. The transparent electrode 170 may be formed of ITO, IZO, ITZO and ICO, but not limited thereto.

According to embodiments of the present invention, the aperture ratio of the microcells may be improved by modifying the structure of the quench resistors connected to the photodiode of the microcells in series. Accordingly, the ratio of light-receiving area to the entire area of the silicon photomultiplier may increases.

Additionally, since the size of the microcell in the silicon photomultiplier may be reduced, densification of microcells may improve. Therefore, the dynamic range of light intensity may increase.

Furthermore, by using nanoimprint lithography, a silicon photomultiplier having high-density and high-efficiency microcells can be formed, and the fabrication cost of the silicon photomultiplier can be saved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A silicon photomultiplier, comprising:
    a first conductive type semiconductor layer;
    a first conductive type buried layer disposed in a lower portion of the first conductive type semiconductor layer, and having a higher impurity concentration than the first conductive type semiconductor layer;
    quench resistors spaced from each other and disposed on the first conductive type semiconductor layer;
    a transparent insulator formed on the first conductive type semiconductor layer, and exposing the quench resistors;
    second conductive type doped layers disposed under the quench resistors to contact the first conductive type semiconductor layer; and
    a transparent electrode covering the transparent insulator and the top surfaces of the quench resistors, the transparent electrode being commonly and electrically connected to the quench resistors.

2. The silicon photomultiplier of claim 1, wherein the farther the transparent insulator is from the quench resistors, the thicker the transparent insulator is.

3. The silicon photomultiplier of claim 1, wherein the transparent insulator contacts the first conductive type semiconductor layer, and have a lower surface concaved towards the first conductive type buried layer.

4. The silicon photomultiplier of claim 1, wherein the top surfaces of the transparent insulator are coplanar with the top surface of the quench resistors.

5. The silicon photomultiplier of claim 1, wherein the quench resistors are arranged in a pattern of hexagonal lattice.

6. The silicon photomultiplier of claim 1, wherein the quench resistors are formed of polysilicon.

7. The silicon photomultiplier of claim 1, wherein the transparent insulator is formed of one selected from the group consisting of silicon dioxide film, silicon nitrides, PDMS and PMMA.

8. The silicon photomultiplier of claim 1, wherein the transparent electrode is formed of one selected from the group consisting of ITO, IZO, ITZO, ICO and poly (3,4-ethylenedioxythiophene).

9. A method for fabricating a silicon photomultiplier, the method comprising:
   forming a first conductive type buried layer in a lower portion of a first conductive type semiconductor layer;
   forming a second conductive type doped layer in an upper portion of the first conductive type semiconductor layer;
   forming a quench resistor layer on the second conductive type doped layer;
   forming quench resistors defined by recessed regions which are formed by patterning the quench resistor layer, the second conductive type doped layer and portions of the first conductive type semiconductor layer;
   forming a transparent insulator filling the recessed regions; and
   forming a transparent electrode covering the transparent insulator and surfaces of quench resistors.

10. The method of claim 9, wherein the recessed regions have lower surfaces concaved towards the first conductive type buried layer.

11. The method of claim 9, wherein the recessed regions expose the first conductive type semiconductor layer.

12. The method of claim 9, wherein the forming of the recessed regions comprises isotropically etching the quench resistors layer, the second conductive type doped layer and portions of the first conductive type semiconductor layer.

13. The method of claim 9, wherein the forming of the quench resistors layer comprises depositing a polysilicon layer on top of the second conductive type doped layer.

14. The method of claim 9, wherein the forming of the transparent insulator comprises:
   forming a transparent insulating layer on the structure the recessed regions are formed; and
   planarizing the top surface of the transparent insulator to expose the top surfaces of the quench resistors.

15. The method of claim 9, wherein the transparent insulator is formed of one selected from the group consisting of PDMS, PMMA, silicon dioxide film and silicon nitrides.

16. The method of claim 9, wherein the transparent electrode is formed of one selected from the group consisting of ITO, IZO, ITZO ICO and poly (3,4-ethylenedioxythiophene).

* * * * *